(12) United States Patent
Henson et al.

(10) Patent No.: US 8,184,691 B1
(45) Date of Patent: May 22, 2012

(54) MANAGING TELEMETRY BANDWIDTH AND SECURITY

(76) Inventors: Kevin Martin Henson, Garland, TX (US); Eric Myron Smith, Dallas, TX (US)

( * ) Notice: Subject to any disclaimer, the term of this patent is extended or adjusted under 35 U.S.C. 154(b) by 1604 days.

(21) Appl. No.: 11/496,163

(22) Filed: Jul. 31, 2006

Related U.S. Application Data

(60) Provisional application No. 60/704,507, filed on Aug. 1, 2005.

(51) Int. Cl.
*H04N 7/12* (2006.01)
(52) U.S. Cl. .............. 375/240.02; 380/255; 380/269
(58) Field of Classification Search ......... 375/240.01–240.29, 384.1–440.1; 348/384.1–440.1, 240.01–240.29
See application file for complete search history.

(56) References Cited

U.S. PATENT DOCUMENTS

| | | | | |
|---|---|---|---|---|
| 5,001,418 A * | 3/1991 | Posse et al. | ............ | 324/73.1 |
| 5,479,587 A * | 12/1995 | Campbell et al. | ............ | 358/1.17 |
| 5,719,985 A * | 2/1998 | Ito et al. | ............ | 386/332 |
| 5,778,395 A * | 7/1998 | Whiting et al. | ............ | 1/1 |
| 5,982,937 A * | 11/1999 | Accad | ............ | 382/239 |
| 6,026,097 A * | 2/2000 | Voois et al. | ............ | 370/468 |
| 6,154,155 A * | 11/2000 | Hershey et al. | ............ | 341/65 |
| 7,379,475 B2 * | 5/2008 | Minami et al. | ............ | 370/469 |
| 7,570,692 B2 * | 8/2009 | Ahn et al. | ............ | 375/240.28 |
| 7,733,915 B2 * | 6/2010 | Kobayashi | ............ | 370/477 |
| 2001/0028743 A1 * | 10/2001 | Kostrzewski et al. | ........ | 382/232 |
| 2002/0016161 A1 * | 2/2002 | Dellien et al. | ............ | 455/403 |
| 2003/0171919 A1 * | 9/2003 | Kim et al. | ............ | 704/229 |
| 2004/0006433 A1 * | 1/2004 | Robson et al. | ............ | 702/20 |

* cited by examiner

*Primary Examiner* — Andy S. Rao
*Assistant Examiner* — James Anderson, II

(57) ABSTRACT

An encryption and authentication technique that achieves enhanced integrity verification through assured error-propagation using a multistage sequence of pseudorandom permutations. The present invention generates intermediate data-dependent cryptographic variables at each stage, which are systematically combined into feedback loops. The encryption technique also generates an authentication tag without any further steps that is N times longer than the block size where N is the number of pseudorandom permutations used in the encipherment of each block. The authentication tag provides a unique mapping to the plaintext for any number of plaintext blocks that is less than or equal to N. In addition to being a stand alone encryption algorithm, the disclosed technique is applicable to any mode that uses pseudorandom permutations such as, key dependent lookup tables, S-Boxes, and block ciphers such as RC5, TEA, and AES.

12 Claims, 3 Drawing Sheets

GENERAL DATA FLOW

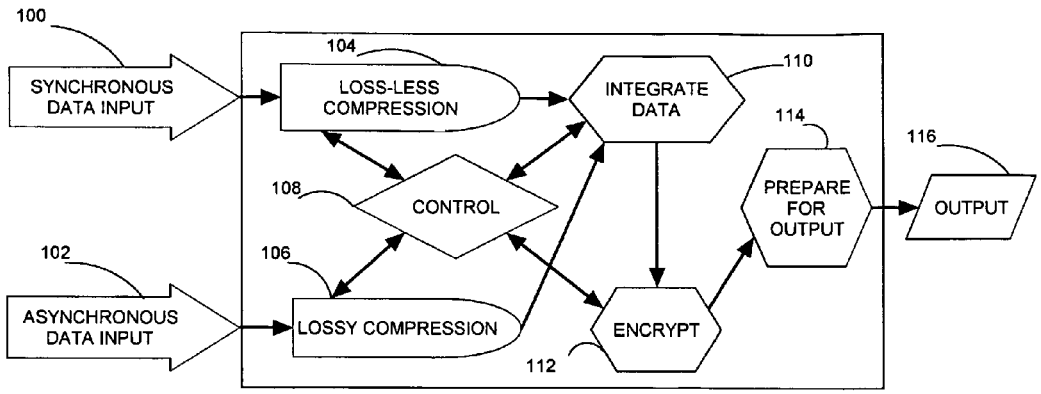
FIGURE 1 GENERAL DATA FLOW
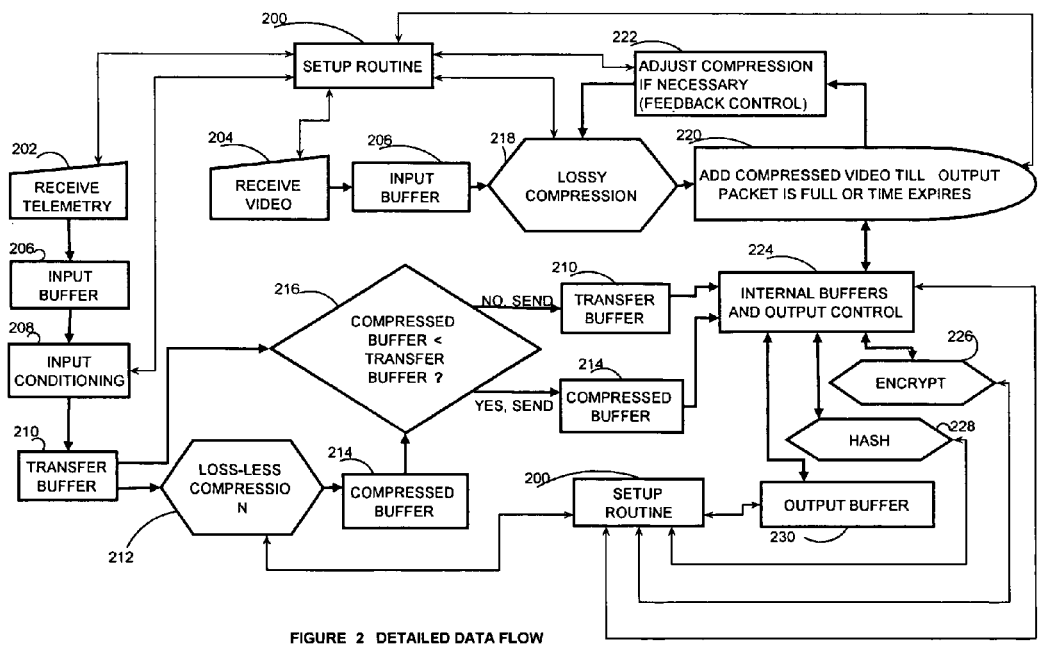
FIGURE 2 DETAILED DATA FLOW

MANAGING TELEMETRY BANDWIDTH AND SECURITY

CROSS REFERENCE TO RELATED APPLICATIONS

The present invention claims priority from U.S. provisional patent application No. 60/704,507, filed on Aug. 1, 2005, the entire contents of which are incorporated by reference herein.

TECHNICAL FIELD OF THE INVENTION

This invention relates generally to the field of information handling and more specifically to a method and system for data compression and encryption. It has special relevance to telemetry applications. The original concept called for this invention to be used in airborne and space-born environment but it is equally valid for terrestrial telemetry bandwidth management and security needs.

BACKGROUND OF THE INVENTION

The security of information poses challenges for businesses and other organizations that transmit and store information. Data encryption is intended to transform data into a form readable only by authorized users. Bandwidth for over the air transmission is also a serious concern.

SUMMARY OF THE INVENTION

This device is designed to reduce the bandwidth needed to send data over communications links. Loss-less compression is used to compress telemetry. Loss-less compression reconstitutes data mathematically identical to the original data set. Different packets of data compress differently under loss-less compression. The normal procedure is to allow the output bandwidths to vary in an asynchronous manner. In certain special circumstance the output must be synchronous. In these cases the left over space in the signal is normally "back filled" with zeros. The advent of variable quality lossy compression allows more useful alternatives that to back fill with zeros. Lossy compression, upon reconstitution, is not mathematically identical to the original data, hence it's name. Video data can be compressed to fill in the available bandwidth and still allow the signal to be synchronous.

Design Considerations

In order to design a hardware device to integrate directly with the existing telemetry and transmission systems onboard the interceptor airframe, several design factors must be considered:

Overall device size—The device must fit within the limited space available within the interior of the missile airframe.

Device weight—As with all flight systems, weight is of considerable importance since it impacts performance.

Low latency—The device must contain a fast enough processor so as not to delay the transmission of critical information.

Low power consumption—There is only a finite amount of electrical power available on board the missile so this application must be considered power-constrained.

Thermal regulation—As with all high-speed electronic processors, this one will generate heat. The management and dissipation for heat must be considered in device design.

Vibration, physical stress—The interior of a missile during launch and boost phase is best characterized as an inhospitable mix of strong vibration at various frequencies and intense compression stresses in rapidly changing planes.

Tamper resistance—As with all military cryptographic devices, the crypto hardware must be highly resistant to tampering and reverse engineering.

BRIEF DESCRIPTION OF THE DRAWINGS

For a more complete understanding of the present invention and for further features and advantages, reference is now made to the following description, taken in conjunction with the accompanying drawings, in which:

For a more complete understanding of the present invention and for further features and advantages, reference is now made to the following description, taken in conjunction with the accompanying drawings, in which:

FIG. 1 is a general data flow in accordance with a preferred embodiment of the present invention;

FIG. 2 is a more detailed data flow in accordance with a preferred embodiment of the present invention;

DETAILED DESCRIPTION OF THE PREFERRED EMBODIMENT

Figure 3:
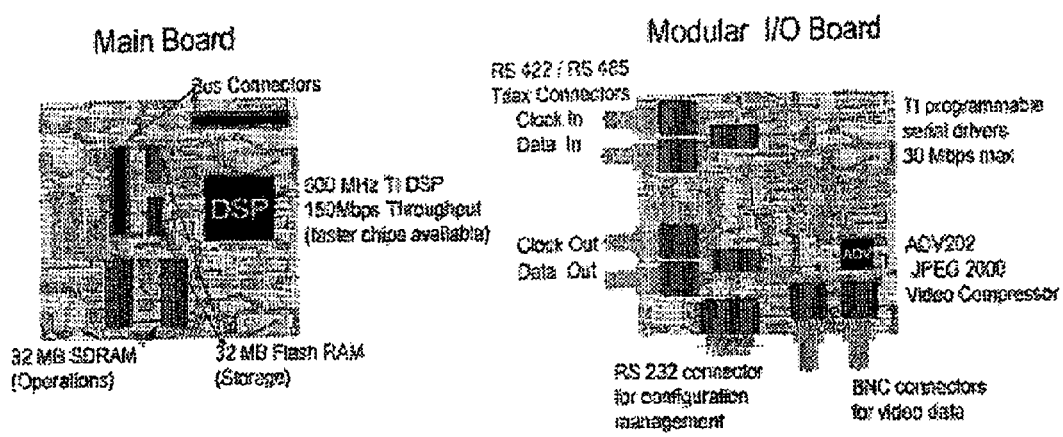
FIG. 3 illustrates a simplified rendering of components in accordance with a preferred embodiment of the present invention.

FIG. 1 shows the basic operation principles. At step 100 synchronous data is brought in through one or more inputs adapted to the purpose. The synchronous input may be anything, but time-synced telemetry data is highly relevant to this invention. This time-sync data may be accompanied by a dedicated clock pulse with its own port. Synchronous data is compressed loss-lessly at step 104 before being prepared for integration at step 110. This compression can be of any suitable method so long as data is not lost. At step 102 asynchronous or secondary data is taken in through suitable input ports. This data could be of many different types. Imagery would be a representative choice. At step 106 lossy compression is preformed on the asynchronous data. The control function at step 108 manages what compression routines are used, the size of input buffers and other critical aspect of this process. The control routing gets instruction either from a setup file or user input, additionally it manages feedback for adjusting the characteristic of the compression routines in real time if necessary. The data from both compression routines is integrated at step 110 before being sent to the encryption engine at 112. Key management is performed by some combination to the control and encryption routines. Any suitable encryption algorithm can be used at step 112. At step 114 the data is prepared for output using any special formatting or error checking that might be required. Finally at step 116 output takes place in whatever format is required for the application.

To make compression ordinarily used for static data-sets work in a dynamic environment, it is necessary to cheat. The flow of data as it is compressed and encrypted as depicted below in FIG. 2. First a setup routine at step 200 determines what critical parameters and algorithms are necessary for a particular compression and encryption task. At step 202 the incoming formatted telemetry data is buffered in as a stream. While it is true that larger samples are more likely to yield better results in terms of compression, they also add latency.

In an inline system such as this, the added latency can be approximated as the time it takes one byte to move through the process from beginning to end. Therefore, the larger the input buffer step 206, the longer the information waits at that point to be processed by an input conditioner step 208 where bytes can be aligned and special characters searched for before sending the data on. Then some fixed amount of data (19,360 bytes in one test) is fed into the compression engine as a transfer buffer step 210. The compression engine at step 212 returns either a smaller buffer step 214, which means the data compressed, or the same buffer which means it was unable to compress the information. Step 216 checks for this. Because compression is based on redundancy or patterns, a truly random sample of characters, has no redundancy and cannot be compressed. While one particular buffer might not compress, most of the ones around it will. Over a comparatively short period of time, an average is reached. The smaller of the two buffers from step 210 or step 214 arrive at an output control step 224 where it joins data from the other compression path step 220.

Data is received from a secondary source such as video at step 204. There may be one or more video or other data sources. Video can be a single frame (still image), motion video, or other secondary source of information (i.e. anything that can be described in a wave-like nature). This information is moved to an input buffer at step 206. This information is fed into a lossy compression engine at step 218. This step may use any suitable algorithm or algorithms and may have its compression parameters varied from buffer to buffer. At step 220 the data is prepared for further processing. It is added to other data already compressed. Step 220 also sets up and compares a compression threshold to establish compression goals that are used in step 222 to adjust the lossy compression parameters used in step 218. Any suitable control or feedback mechanism can be used in step 222. At step 226 the intermediate data is sent into the encryption engine, this may use any suitable encryption algorithm and return an encrypted buffer. At step 238 a HASH function is performed if necessary to ensure the integrity of the data. At step 230 the data is ready to be placed in the output stream.

For given telemetry and video compression engines, the only thing that the system can do to control the bit-rate of the output stream is to vary the video quality and thereby indirectly affect the size of compressed video. This control mechanism is described below.

There are three main factors in the system that cause variability in the bit-rate and whose effect must be accounted for:
1. Compression ratio of telemetry data varies with differences in input data
2. Compression ratio of video varies with changes in input video
3. The video frame rate is asynchronous to the telemetry input data clock (for every chunk of input telemetry data, while the average number of video frames processed is constant, the instantaneous number of video frames available is not).

To minimize the effects of (3) above, the preferred embodiment will run the feedback loop at the video codec output rate (i.e. once per ADV202 frame). To control for (1) and (2) above, an error function is computed as:

$e = $ (available output video buffer space) − (current compressed frame size);

NOTE: this is calculated once per packet

Using the equation for the error above, the desired video quality can then be expressed as:

Quality $= P*e + I*$sum $(e0, e1, e2, \ldots, eN)$ where
P=weighting constant for instantaneous error
I=weighting constant for integral of the error This present invention does not expect to take advantage of knowledge of $de(t)/dt$. Use of this could cause the video to track the fluctuations in telemetry compression too closely. It is expected to place more emphasis on the integral of the error resulting in more "smooth" changes to video quality.

If the desired message size is 100 bytes and the intention is to send only 2 messages, then the perfect system would send 2 messages each containing 100 bytes. But in the extreme case that message 1 contains only 10 bytes, then the remaining 90 bytes would normally be filled with all 0s (or sent out as IDLE frames), and the excess message capacity would be lost forever. Since the unused 90 bytes are not remembered for use in the next message, the target size for message 2 would again be the desired size of 100 (for a total of only 110 bytes, with 90 unused bytes). Conversely, if message 1 contained 190 bytes, then the target size for message 2 would still be the desired size of 100 for a total of 290 bytes; with 90 bytes of latency introduced before message 2 is sent.

In this preferred embodiment, example one would correlate to the case of highly compressible telemetry data and insufficient video data to fill up the excess bandwidth. This case will pose no latency problems because all available data flows straight through the system. In other words, every chunk of telemetry data that flows into the system is processed and sent out before the next chunk is received. Example two would correlate to the case of telemetry data that does not compress well. This case will introduce a latency issue. The first part of the telemetry data will flow straight through the system as in example one. But the tail end of the telemetry data will not be sent out until after the next chunk is received.

It is expected that the telemetry data will compress well enough so that this latency issue will not become a system problem. There may be chunks of the telemetry data that don't compress well, which will cause a small amount of latency to occur. But it is expected that the number of uncompressible chunks will be small, so that the total latency does not continue to expand and generate a system failure.

In order to make this invention adaptable for a variety of uses with minimum customization cost, the invention was divided into two discreet functional units. The processing board would contain the main processor, memory and power supply. The I/O board would contain all the necessary components for the various inputs and outputs. This will allow the implementation new I/O configurations at a fraction of the cost of a complete redesign. The functional modules and their major components are shown in FIG. 3 below.

Figure 4:
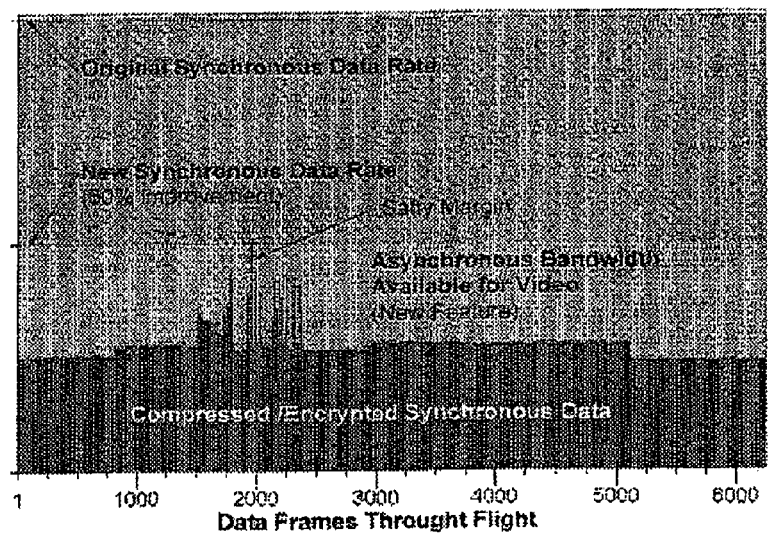
FIG. 4 illustrates a graph depicting Well-behaved compression of OSP telemetry in accordance with a preferred embodiment of the present invention.

In FIG. 4, the height of the gray area represents a conventional raw data-stream. In actual tests, the preferred embodiment compressed sample no worse than 2.2:1 and sometimes achieved 4.7:1, with an average of 3:1. The purple area of the graph represents the bandwidth in megabytes per second (Mbps) that is needed to send the compressed signal out. It is clear that the performance of the compression varies over time based on what is sent into it, but this variability has certain limits. As stated earlier, for the data time sync to be maintained, the output needs to have a consistent bandwidth. In this case 5 Mbps was chosen as the target output bandwidth. The difference between the target data output (5 Mbps) and the actual compressed telemetry bandwidth (~3 Mbps) is ~2 Mbps.

One technique might be to "pad" the signal with zeros or random data but there are better uses for precious bandwidth. Secondary sensor data, such as video from external cameras, can be compressed and sent asynchronously in the green data bands. One special characteristic of lossy compression techniques such as 2D and 3D wavelet image compression is their "tune-ability."

Several members of the wavelet class of algorithms have compression ratios as a parameter variable in real time. Video, or any other data can be compressed in a lossy manner, can be sized to exactly fit within the available bandwidth created by loss-lessly compressing the telemetry data. This way synchronicity of the telemetry data is maintained and additional useful information is passed down.

Figure 5:
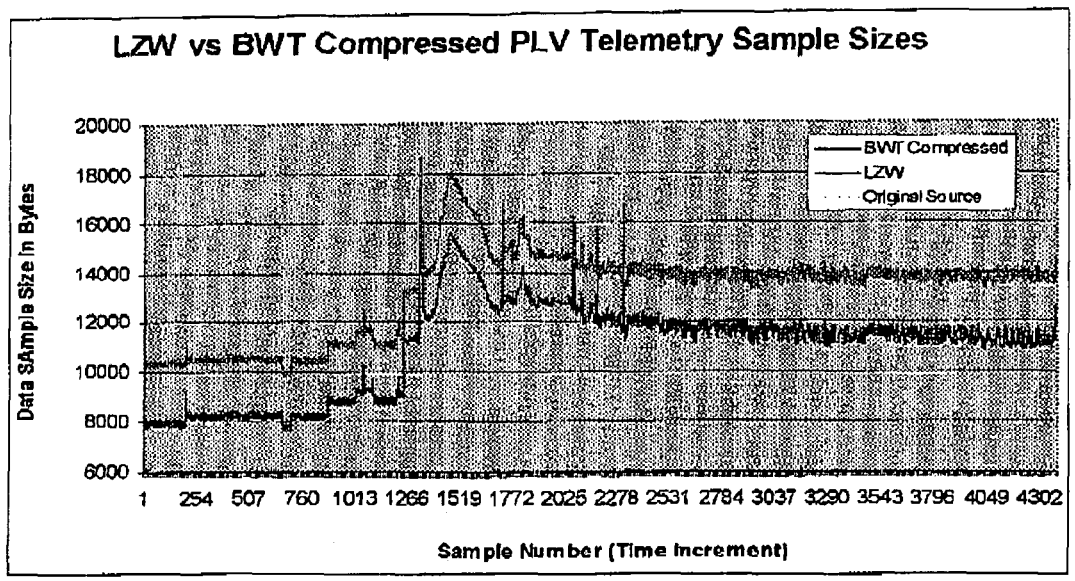
FIG. 5 illustrates a graph depicting PLV Data frame—Size over time in accordance with a preferred embodiment of the present invention.

Possible uses for asynchronous data downlink:
External video feed showing surface of airframe
IR targeting sensor feed
Acoustical vibration measurements from airframe
Any other data that has a wavelike structure is a good candidate for wavelet compression FIG. 5 is the comparison the original "Source" and compressed PLV telemetry data, with both LZW and BWT compression. The BWT algorithm is a significant improvement over the LZW method. In contrast to the OSP data, which showed an average compression of around 3:1 and a worst case of 2:1, with BTW the PLV data compressed on average 1.8:1, and at worst case 1.21:1. This worst case occurs about a third of the way thought the flight. It can therefore be concluded that, in the case of the PLV data, marginal 15% reduction in synchronous bandwidth can be achieved. That is not to say that the PLV would not benefit from the proposed integrated compression encryption device.

The compression achieved over the vast majority of the flight would allow the asynchronous transmission of additional data and the security of the transmission would be dramatically enhanced.

In one embodiment of the present invention, a system for data compression system comprises an input operable to receive a plurality of data and or video in appropriate format, a memory operable to store a incoming data and program instructions, a processor coupled to the memory and to the input and operable to repeat the following for subsequent data elements: establish or load a compression threshold goal, input a data element compress data with loss-less compression, ensure that the data compressed with the loss-less algorithm is less than the threshold goal, place the compressed data in an output buffer, input secondary data that can be compressed with a lossy algorithm, compress the secondary data with a lossy algorithm and fit it into the space between the loss-less compressed data and the threshold.

In the system, a feedback algorithm is used to adjust the quality level of the lossy compression algorithm, wherein multiple loss-less compression algorithms are supported, wherein multiple lossy compression algorithms are supported, wherein multiple data inputs are supported, wherein multiple video inputs are supported, wherein the input/output module is replaceable for various operational requirements, wherein the compressed data is encrypted prior to output, wherein the combined loss-less and lossy data has a synchronous output bit-rate after compression and encryption, and wherein multiple encryption algorithms are supported.

In another embodiment of the present invention, a system for data compression and encryption comprises one or more inputs that receive at least one of: data and video, a memory that stores the received data and video, a processor coupled to the memory and to the input that repeats the following for subsequent data elements: establish a compression threshold, input and compress a data element with loss-less compression, place the compressed data element in a transit buffer, input a secondary data element that can be compressed with a lossy compression, compress the secondary data element with the lossy compression, and integrate the compressed secondary data element into a space between the loss-less compressed data element and the threshold.

In a further embodiment of the present invention, a method comprises combining lossy compressed data and loss-lessly compressed data into a single output data stream. The method comprises dynamically adjusting a lossy compression related to the lossy compressed data, encrypting the output data stream, performing a hash function on the output data stream.

Although an exemplary embodiment of the system of the present invention has been illustrated in the accompanied drawings and described in the foregoing detailed description, it will be understood that the invention is not limited to the embodiments disclosed, but is capable of numerous rearrangements, modifications, and substitutions without departing from the spirit of the invention as set forth and defined by the following claims. For example, the capabilities of the invention can be performed fully and/or partially by one or more of the elements. Also, these capabilities may be performed in the current manner or in a distributed manner and on, or via, any device able to provide and/or receive information. Further, although depicted in a particular manner, various modules or blocks may be repositioned without departing from the scope of the current invention. Still further, although depicted in a particular manner, a greater or lesser number of modules and connections can be utilized with the present invention in order to accomplish the present invention, to provide additional known features to the present invention, and/or to make the present invention more efficient. Also, the information sent between various modules can be sent between the modules via at least one of a wireless source, and a wired source and via plurality of protocols.

What is claimed is:

1. A system for data compression, the system comprising:
   an input module operable to receive a plurality of data and or video in appropriate format;
   a memory operable to store incoming data and program instructions;
   a processor coupled to the memory and the input module, the processor operable to repeat the following for subsequent data elements:
   establish or load a compression threshold establishing a compression goal for lossy compression based on a size of a data packet for synchronous data transfer;
   input a data element and compress the data element with a loss-less compression algorithm to generate loss-less compressed data;
   place the loss-less compressed data in an output buffer;
   input secondary data that can be compressed with a lossy algorithm and compress the secondary data with the lossy algorithm to generate lossy-compressed data;
   ensure that the lossy-compressed data is less than the compression threshold;
   place the lossy-compressed data into an output buffer and generate the data packet comprising the loss-less compressed data and lossy compressed data in the output buffer for synchronous transmission;
   wherein the loss-less compressed data is telemetry data and the lossy-compressed data is video data;
   wherein a compression ratio of the video data varies with changes in the input video data; and
   wherein the processor is operable to determine a desired video quality based upon the following formula:

$$\text{Quality} = P^*e + I^*\text{sum}(e0, e1, e2, \ldots eN),$$

wherein e=(available output video buffer space)−(current compressed frame size), P=weighing constant for instantaneous error, and I=weighing constant for integral of error.

2. The system of claim 1, wherein a feedback algorithm is used to adjust a quality level of the lossy compression algorithm.

3. The system of claim 1, wherein multiple loss-less compression algorithms are supported.

4. The system of claim 1, wherein multiple lossy compression algorithms are supported.

5. The system of claim 1, wherein multiple data inputs are supported.

6. The system of claim 1, wherein multiple video inputs are supported.

7. The system of claim 1 wherein at least one of the input module and an output module is replaceable for various operational requirements.

8. The system of claim 1, wherein the loss-less compressed data is encrypted prior to output.

9. The system of claim 8, wherein the combined loss-less compressed data and lossy compressed data has a synchronous output bit-rate after the compression and encryption.

10. The system of claim 9, wherein multiple encryption algorithms are supported.

11. The system of claim 1, wherein a compression ratio of the telemetry data varies with differences in input data.

12. The system of claim 1, further comprising an output module operable to transmit the generated data packets synchronously with the data clock.

* * * * *